(12) United States Patent
Ito et al.

(10) Patent No.: US 6,718,824 B2
(45) Date of Patent: Apr. 13, 2004

(54) SEMICONDUCTOR DYNAMIC QUANTITY DETECTING SENSOR AND MANUFACTURING METHOD OF THE SAME

(75) Inventors: Takeshi Ito, Okazaki (JP); Kazushi Asami, Okazaki (JP); Tsuyoshi Fukada, Aichi-gun (JP); Hirofumi Higuchi, Okazaki (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 13 days.

(21) Appl. No.: 10/013,508

(22) Filed: Dec. 13, 2001

(65) Prior Publication Data

US 2002/0073779 A1 Jun. 20, 2002

(30) Foreign Application Priority Data

Dec. 20, 2000 (JP) .................................. 2000-387622

(51) Int. Cl.$^7$ ..................... G01P 15/00; H01L 21/00
(52) U.S. Cl. ................ 73/514.16; 73/514.32; 438/52
(58) Field of Search .................. 73/514.16, 514.32; 438/48, 52, 53

(56) References Cited

U.S. PATENT DOCUMENTS 6,117,701 A * 9/2000 Buchan et al. ............... 438/52
6,287,885 B1   9/2001 Muto et al.

FOREIGN PATENT DOCUMENTS

JP    A-5-343705    12/1993
JP    A-9-257564    10/1997

* cited by examiner

Primary Examiner—Hezron Williams
Assistant Examiner—Jacques Saint-Surin
(74) Attorney, Agent, or Firm—Posz & Bethards, PLC

(57) ABSTRACT

A semiconductor dynamic quantity sensor, for example, an acceleration sensor is formed on a SOI substrate having an activation layer and a supporting layer with an oxide film interposed therebetween. A structure for the sensor is formed in the activation layer. An opening is formed in the supporting layer and the oxide film to expose the structure. In this sensor, stress layer is formed in the activation layer at a side contacting the oxide film. The stress layer is removed at a region facing the opening to prevent the structure from cambering.

13 Claims, 5 Drawing Sheets

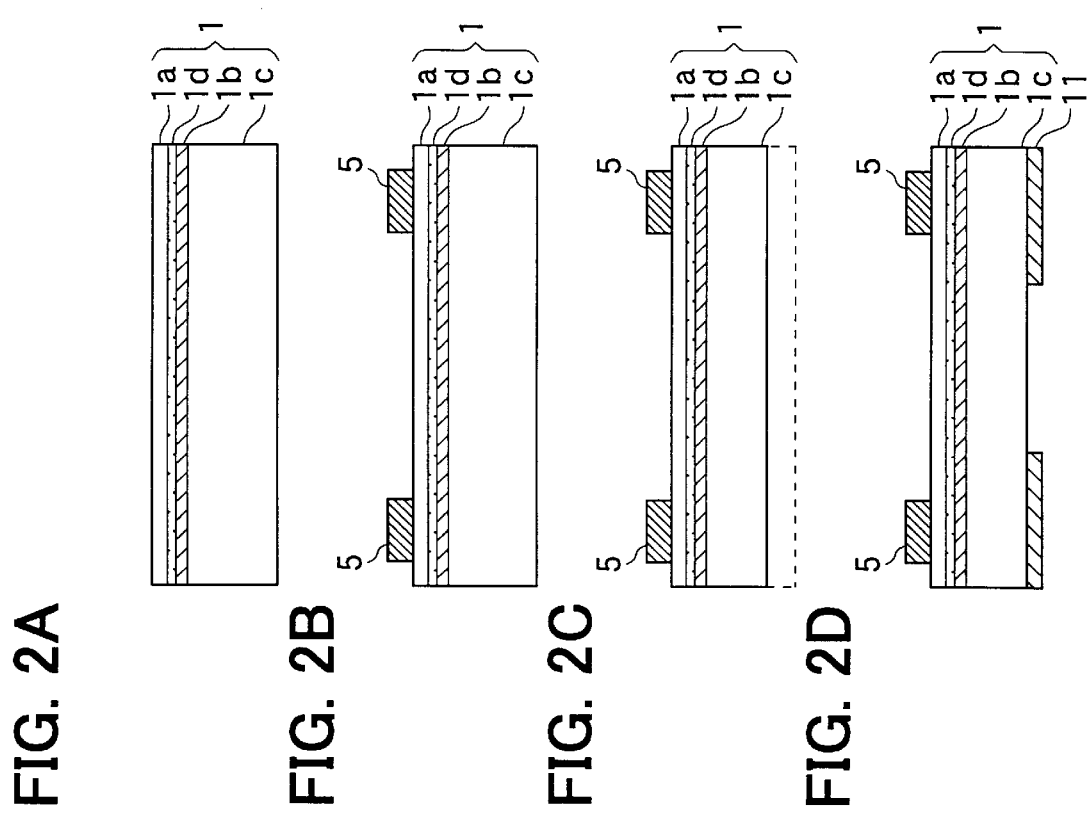

SEMICONDUCTOR DYNAMIC QUANTITY DETECTING SENSOR AND MANUFACTURING METHOD OF THE SAME

CROSS REFERENCE TO RELATED APPLICATION

This application is based upon Japanese Patent Application No. 2000-387622 filed on Dec. 20, 2000, the contents of which are incorporated herein by reference.

BACKGROUND OF THE INVENTION

1. Field of the Invention

The present invention relates to a semiconductor sensor, for example, an acceleration sensor or an angular velocity sensor that employs a structure movable in accordance with physical quantity applied thereto, and manufacturing method of the same.

2. Related Art

Recently, a semiconductor sensor that detects dynamic quantity such as acceleration or pressure can be provided by micro-machining process in which a laminated substrate such as a SOI (Silicon On Insulator) substrate is employed. FIG. 6 shows a schematic cross sectional view of a semiconductor dynamic quantity sensor 100. The semiconductor dynamic quantity sensor 100 has a laminated substrate 110 that is composed of a first semiconductor substrate 111 and a second semiconductor substrate 112 to support the first semiconductor substrate 111 with an oxide film 113 interposed therebetween. A structural portion is formed in the first semiconductor substrate 111.

The oxide film 113 and the second semiconductor substrate are partially removed at a region corresponding to the structure 101. As a result, the structure 101 forms a diaphragm shape. Incidentally, the structure 101 may form a one-end supporting beam structure (hereinafter, cantilevered beam structure) in accordance with a sensor structure.

The semiconductor dynamic quantity sensor 100 is formed with the following steps. First, the laminated substrate 110 is prepared. Then, a circuit or the like is formed on the first semiconductor substrate 111. After that, the second semiconductor substrate is partially removed by etching to form an opening 102. Moreover, the oxide film is removed at a portion corresponding to the opening 102 so as to form the structure 101 in the first substrate 111 on the opening 102.

It is easy to make the structure 101 having very fine and narrow gap by employing the oxide film 103 as a sacrificial layer in the laminated substrate 110, which is removed by etching in the process to form the minute structure 101, and to control thickness of the structure 101 when employing the laminated substrate.

When dynamic quantity is applied to the semiconductor dynamic quantity sensor 100, the structure having the diaphragm structure or the cantilevered beam structure is slightly deformed or displaced, so that the dynamic quantity can be detected. Recently, high accuracy in detection is required in the semiconductor dynamic quantity sensor 100.

It is, however, difficult to obtain the high accuracy in the semiconductor dynamic quantity sensor 100. FIG. 7 shows a schematic cross sectional view of a semiconductor dynamic quantity sensor 100 having a cantilevered beam structure. The structure 101 cambers to a direction opposite to the opening 102.

In the acceleration sensor, acceleration applied to the sensor is detected by detecting change in capacitance based on change in distance between a movable electrode and a fixed electrode as the cantilevered beam structure. Therefore, when the structure 101 cambers, it is difficult to face the movable electrode to the fixed electrode appropriately. As a result, it is difficult to detect the acceleration precisely.

SUMMARY OF THE INVENTION

This invention has been conceived in view of the background as described above and an object of the invention is to provide a semiconductor sensor capable of detecting dynamic quantity precisely.

The inventors in the present invention found a fact that the structure 101 formed in the first semiconductor substrate 111 cambers by a stress layer 114 formed on a surface (back surface) of substrate 111 that faces the opening 102.

It is supposed that the stress layer 114 is formed at a surface portion of the first substrate 111 adhering to the oxide film 113 by diffusion of oxygen when adhering the first substrate 111 to the second substrate 112 through the oxide film. The oxygen diffused in the first substrate is supposed to cause lattice stress.

This stress layer causes deterioration in detection in the pressure sensor as well as the acceleration sensor.

The inventors measured amount of camber in the structure 101 having the cantilevered beam as a sample of the semiconductor dynamic quantity sensor after removing the back surface of the structure 101. The sensor structure is shown in FIG. 7. Beam length L is 5.2 mm, thickness S of the first substrate 111 is 15 $\mu$m. In this situation, the amount of camber $\delta$ is measured when etching amount in the back surface of the structure 101 is changed. The amount of camber $\delta$ is defined with distance between a surface of the first substrate 111 and a top of the cambered structure 101.

FIG. 5 shows a result of measurement of the camber. The amount of camber is reduced when the back surface of the structure 101 is etched by 0.2 $\mu$m. Moreover, the amount of camber is reduced as the etching amount is increased. When the etching amount is 0.4 $\mu$m or more, the amount of camber is reduced prominently as shown in FIG. 5.

After the first substrate 111 is adhered to the oxide film 113, the oxide film is removed and oxygen concentration is measured while the first substrate 111 is etched gradually from the back surface that adhered to the oxide film 113 to convince that the stress layer 114 is formed by the oxygen in the oxide film 113.

As a result, the oxygen concentration is highest at the back surface that adhered to the oxide film. Moreover, the oxygen concentration is reduced as the first substrate 111 is etched. Besides, dependency in the oxygen concentration with respect to the etching amount is similar to dependency in camber with respect to the etching amount shown in FIG. 5. Therefore, the stress layer 114 including oxygen in the first substrate 111 should be removed so that the camber is reduced sufficiently.

According to a first aspect of the invention, a semiconductor sensor has a structure formed in a first substrate that is formed on a second substrate with an oxide film interposed therebetween. The oxide film under the structure is removed. Besides, a part of the structure is removed at a portion that adheres to the oxide film before the oxide film is removed. The removed portion of the structure includes oxygen at high concentration in comparison with the bulk of the first substrate.

Preferably, a thickness of removed portion of the structure is 0.2 $\mu$m or more to improve sensitivity of the sensor.

More preferably, the thickness of removed portion of the structure is 0.4 μm or more.

Other features and advantages of the present invention will become more apparent from the following detailed description made with reference to the accompanying drawings.

BRIEF DESCRIPTION OF THE DRAWINGS

FIGS. 2A to 2H are cross sectional views showing manufacturing steps of the acceleration sensor in the first embodiment;

DETAILED DESCRIPTION OF THE PREFERRED EMBODIMENT

Figure 1:
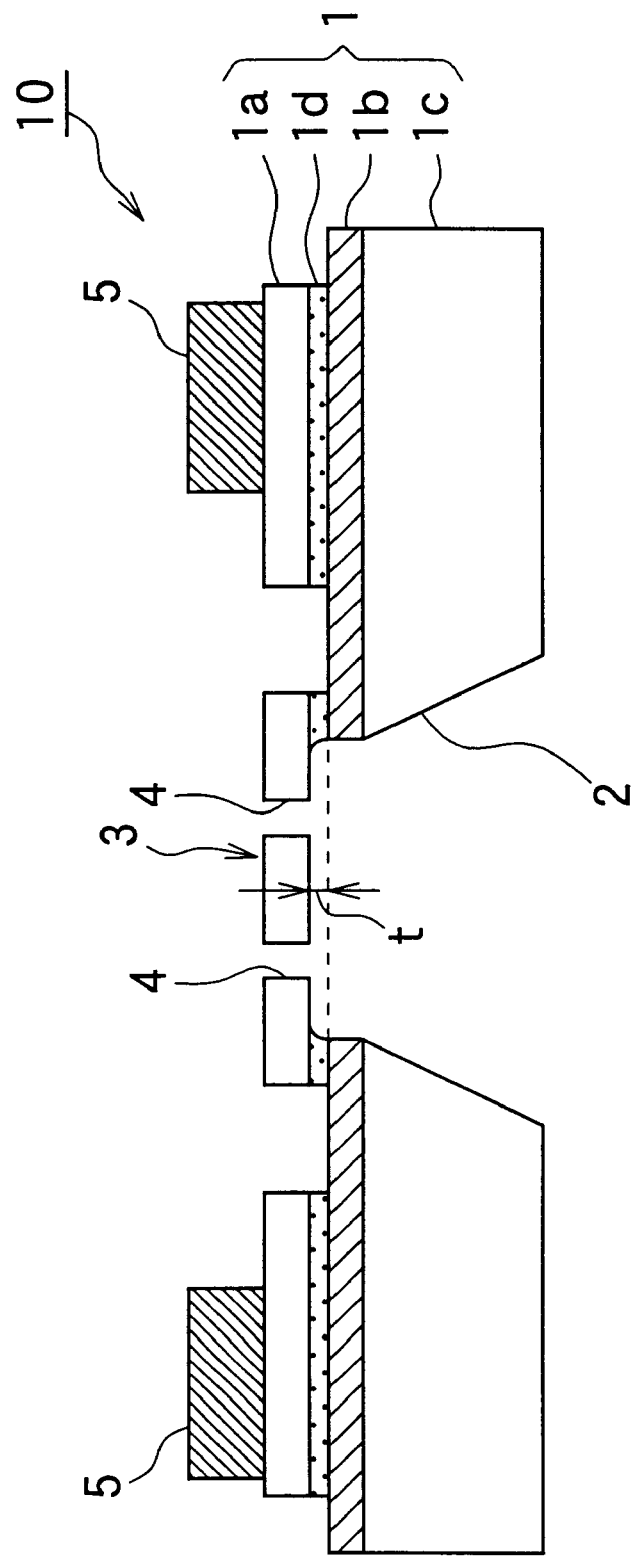
FIG. 1 is a schematic cross sectional view of an acceleration sensor in the first embodiment of the present invention.

Specific embodiments of the present invention will now be described hereinafter with reference to the accompanying drawings in which the same or similar component parts are designated by the same or similar reference numerals.

Referring to FIG. 1, a schematic cross sectional view of an acceleration sensor 10 is shown as an example of a semiconductor dynamic quantity sensor. The acceleration sensor 10 is formed with a laminated substrate 1 in which an activation layer 1a as a first semiconductor substrate is adhered to a supporting layer 1c as a second substrate with an oxide film 1b interposed therebetween. The activation layer 1a and the supporting layer 1c are composed of Si (silicon), and the laminated substrate is a SOI substrate.

In such the SOI substrate, a stress layer 1d is formed between the activation layer 1a and the oxide layer 1b. The stress layer id is composed of a part of the activation layer, which includes oxygen therein. It is supposed that the stress layer 1d is formed by diffusion of oxygen in the oxide film 1b into the activation layer 1a when the SOI substrate 1 is prepared, and that deformation is caused in crystal lattices by the diffusion of oxygen.

The supporting layer 1c and the oxide film 1b are partially removed so as to form an opening 2 to expose a back surface (surface at the opening) of the activation layer 1a. Moreover, the stress layer id is removed at a portion that is exposed at the opening 2.

More specifically, the stress layer id that faces the opening is removed at a thickness t of 0.2 μm or more. The "t" is a distance between an interface between the stress layer 1d and the oxide film 1b and the activation layer 1a. A structure 3 is formed in the activation layer 1a at a portion corresponding to the opening 2.

Figure 5:
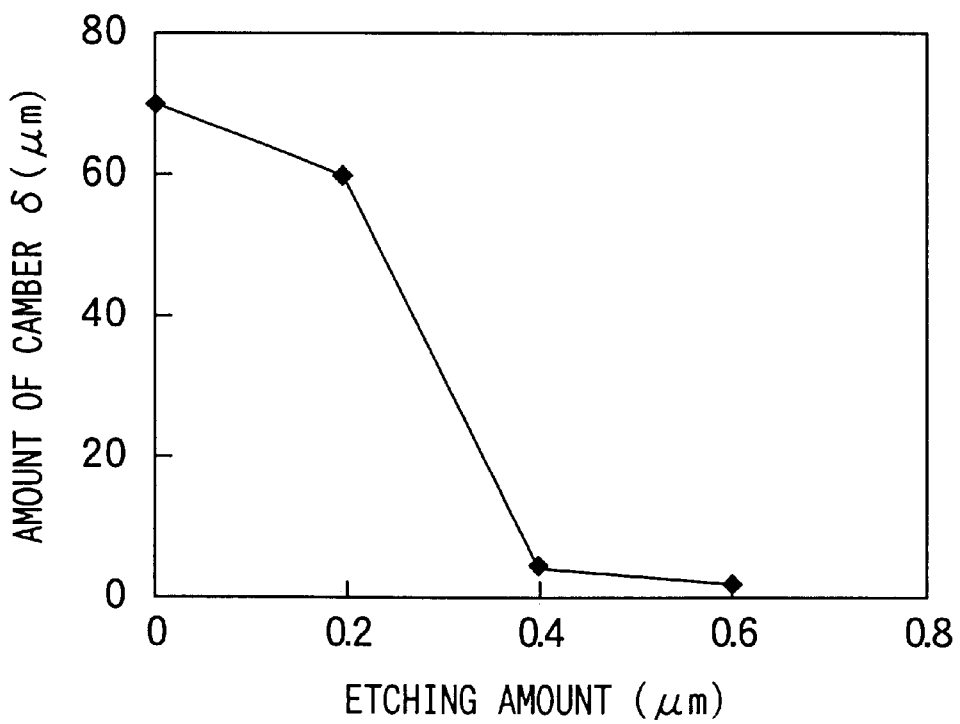
FIG. 5 is a graph showing a relationship between amount of camber of the structure in the sensor and etching amount of the structure.

Amount of camber of the structure 3 is reduced by removing the activation layer 1a at the back surface thereof (stress layer 1d) at a thickness t of 0.2 μm or more as shown in FIG. 5. Preferably, the activation layer 1a is removed at the thickness t of 0.4 μm or more so as to reduce camber of the activation layer surely.

In the structure 3, trenches 4 are formed so that the trenches 4 penetrate the activation layer 1a from a main surface (a surface opposite to the opening 2) to the opening 2. Movable electrodes (not shown) and fixed electrodes (not shown) are formed as a cantilevered beam structure in which one end thereof is supported with the activation layer 1a or a movable portion formed in the activation layer, and the other end thereof is not supported. That is, the movable electrode or the fixed electrode in the cantilevered beam structure has a protruding shape such as teeth of a comb. Incidentally, a circuit (not shown) is formed on the activation layer 1a, and electrode pads 5 are formed with aluminum on the circuit.

When acceleration is applied to the sensor 10, distance between a detection face of the fixed electrode and a detection face of the movable electrode changes. A capacitor is formed between the fixed electrode and the movable electrode, and therefore, electrostatic capacitance of the capacitor changes in accordance with displacement of the movable electrode when the acceleration is applied to the movable electrode. The acceleration applied to the sensor is detected by detecting change in the electrostatic capacitance.

Next, manufacturing method of the sensor 10 is described with reference to FIGS. 2A to 2H.

First, the SOI substrate 1 is provided as shown in FIG. 2A. The SOI substrate 1 has the supporting layer 1c as a single crystal silicon wafer, the activation layer 1a as a single crystal silicon thin film, and the oxide film 1b as a sacrificial layer. That is, the activation layer 1a is laminated on the supporting layer 1c with the oxide film 1b interposed therebetween.

Incidentally, the supporting layer 1c has, for example, a (1 0 0) face orientation at a surface thereof, a thickness of 300 μm or more, and low impurity concentration. The activation layer 1a has, for example, a (1 0 0) face orientation at a surface thereof, a thickness of approximately 15 μm. Moreover, the activation layer 1a includes phosphorus (P) therein as impurity at high concentration (approximately $1 \times 10^{19}/cm^3$ or more) to be lowered resistivity thereof and make ohmic contact with the electrode pads 5.

As shown in FIG. 2B, the electrode pads 5 are formed on the activation layer 1a. In this step, aluminum film is formed on the entire surface of the activation film at a thickness of, for example, 1 μm by deposition (evaporation). Then, the aluminum film is patterned using photolithography and etching techniques to form the electrode pads 5. Well-known Heat treatment (sintering) may be performed to make the ohmic contact with the activation layer 1a as occasion arises.

As shown in FIG. 2C, the supporting substrate 1c is grinded and polished at a back surface thereof (opposite to a surface on which the oxide film 1b is disposed) to reduce a thickness thereof to approximately 300 μm. Then, mirror finish is performed at the processed back surface of the supporting substrate.

As shown in FIG. 2D, silicon nitride film is formed on the entire surface of the mirror finished back surface of the supporting substrate by, for example, plasma CVD method at a thickness of 0.5 μm. Then, the silicon nitride film is patterned by photolithography and etching to form a mask pattern 11 for forming the opening 2.

After that, as shown in FIG. 2E, trenches 4 are formed in the activation layer 1a. Specifically, anisotropic etching is carried out using a dry etching apparatus with resist film (not shown), which is resistant to dry etchant gas, whereby the trenches 4 extend in the activation layer 1a to reach the silicon oxide film 1b.

In this state, a first etching step is carried out as shown in FIG. 2F. The supporting layer 1c is selectively removed at a portion that is not covered by the mask 11 from the back surface thereof (the opposite surface to the oxide film 1b) by using KOH solution. As a result, a back surface of the oxide film 1b (surface opposite to the activation layer 1a) is exposed, and a part the opening 2 is formed. Then, the mask 11 is removed.

Incidentally, a surface of the SOI substrate 1 (a side of the activation layer 1a) is covered with a resist film before the first etching step is performed, although the resist is not shown in FIG. 2F. The resist is removed after, for example, the first etching step is finished.

Thereafter, a second etching step (releasing step) is carried out as shown in FIG. 2G. The oxide film 1b is removed at a portion exposed after the supporting layer 1c is removed, by etching with, for example, a $CHF_3$ gas comprising hydrogen as an etching gas. As a result, the opening 2 is formed, whereby the fixed electrodes and movable electrodes are released. In this state, the stress layer 1d remains on a back surface of the structure 3 that faces the opening 2.

A third etching step is performed to remove the stress layer id as shown in FIG. 2H. The stress layer 1d is etched from a side exposed to the opening 2. An etching condition is different form that of the second etching step. For example, a $CF_4$ gas is employed as an etching gas with $O_2$ gas, and partial pressure of the $O_2$ gas is regulated so that etching selectivity of silicon to $SiO_2$ becomes higher. Therefore, the back surface of the activation layer 1a (the stress layer 1d) is not etched by continuing the etching of the oxide film 1b using the $CHF_3$ gas in the second etching step, but etched intentionally using other etching gas described above.

In this case, a predetermined thickness of the activation layer 1a is removed by controlling etching time based on etching rate of the stress layer 1d when using the etching gas described above. The etching rate is determined previously. Thus, the structure 3 is provided on the opening 2.

After that, a dicing step is carried out to cut the SOI substrate 1 into sensor chips, whereby the acceleration sensor 10 is completed.

As described above, camber of the structure 3 having the cantilevered fixed electrodes and movable electrodes can be reduced by removing the stress layer 1d located on the back surface of the activation layer 1a, which is exposed on the opening 2. As a result, the each of the fixed electrodes faces each of the movable electrodes reliably, so that the sensor can sense change in distance between the fixed electrode and the movable electrode sensitively when the acceleration is applied to the movable electrodes, whereby sensitivity of the sensor 10 is improved.

(Second Embodiment)

Figure 3A:
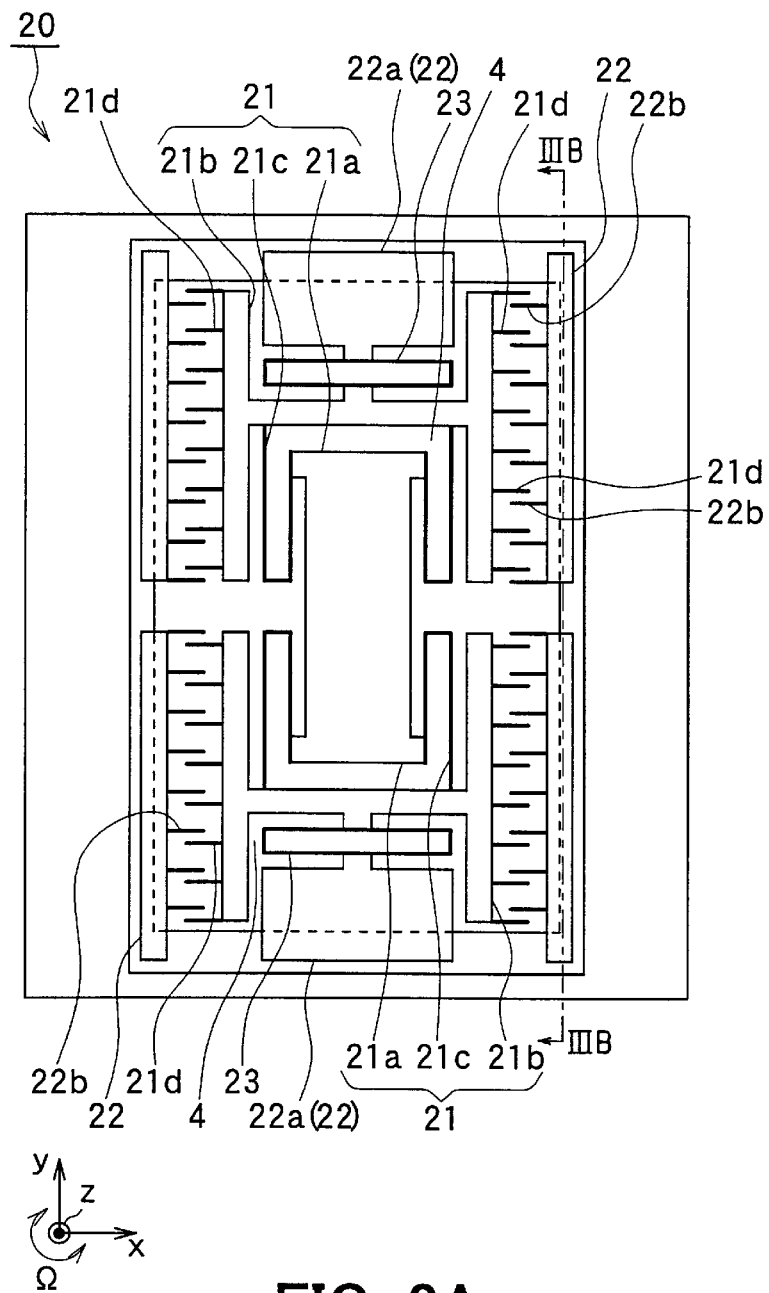
FIG. 3A is a plan view of an angular velocity sensor in the second embodiment of the present invention.
Figure 3B:
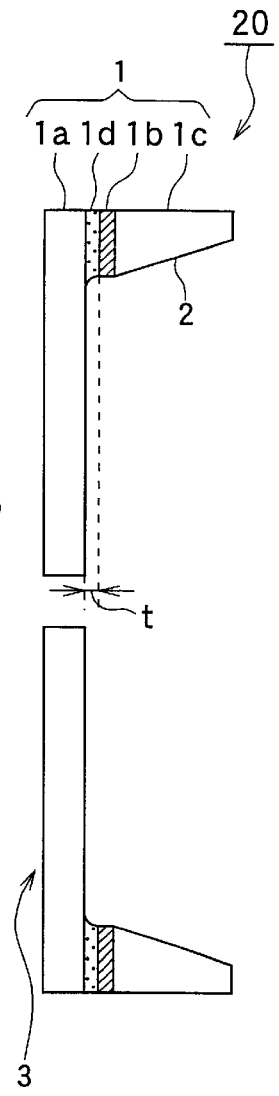
FIG. 3B is a schematic cross sectional view of the angular velocity sensor taken along line IIIB—IIIB.

In this embodiment, an angular velocity sensor is adopted as the semiconductor dynamic quantity sensor. Referring to FIGS. 3A and 3B, the angular velocity sensor is formed in a SOI substrate 1 having an activation layer 1a (first semiconductor substrate) and a supporting layer 1c (second semiconductor layer) with an oxide film 1b interposed therebetween. Moreover, a part (stress layer) 1d of the activation layer 1a is removed at a region that is exposed on an opening 2.

Similarly to the first embodiment, the stress layer id is removed at the opening 2. A removed thickness t of the stress layer id is 0.2 $\mu$m or more, preferably, 0.4 $\mu$m or more.

Trenches 4 are formed in the activation layer 1a on the opening 2 by etching or the like, whereby a structure 3 (beam structure) is formed in the activation layer 3, which has oscillators 21 (movable portions) and fixed portions 22 supported by the supporting layer 1c through the oxide film 1b at an edge of the opening 2.

Each oscillator 21 is composed an inner oscillator 21a having a rectangular shape, an outer oscillator 21b having a H character shape, which is positioned outer with respect to the inner oscillator 21a, and folded driving beams 21 c to connect the inner oscillator 21a to the outer oscillator 21b.

The oscillator 21 is connected to an anchor 22a through a detection beam 23, which is supported by the supporting layer 1c through the oxide film 1b at the edge of the opening 2. The driving beam 21c has spring function to oscillate the inner oscillator 21a in a direction along x axis shown in FIG. 3A. The detection beam 23 has spring function to oscillate the oscillator 21 in a direction along y axis perpendicular to the x axis.

Plurality of comb-teeth shape electrodes 21d are formed in each outer oscillator 21b at both sides thereof along the x axis so as to protrude from the both side of the outer oscillator 21b. On the other hand, plurality of comb-teeth shape electrodes 22b are formed in each fixed portion 22 so that each of which faces each of the comb-teeth shape electrodes 21d. A pair of each electrode 21d and each electrode 22b forms a detection electrode portion, so that the pair makes a capacitor therebetween.

Next, detection of yaw rate is described with the above-described angular velocity sensor. First, the inner oscillators 21c are oscillated in the direction along the x axis by an excitation means (not shown). In this situation, when angular velocity $\Omega$ is applied around z axis perpendicular to the x and y axes, Coriolis force is applied to the oscillators 21a, so that the oscillator 21 is oscillated in the direction along the y axis (detecting oscillation).

The distance between the electrodes 21d and 22b changes by the detecting oscillation. The change in distance described above causes change in capacitance of the capacitor described above, so that the angular velocity is detected by transforming the change in capacitance into voltage or the like.

Manufacturing method of the angular velocity sensor is similar to that of the first embodiment, that is, the angular velocity sensor is completed through the steps shown in FIGS. 2A to 2H. Namely, the stress layer id is removed through the first to third etching steps described above.

In the angular velocity sensor, it is necessary to increase the number of the detection electrodes 21d and 22b in the structure 3, or to lengthen the detection electrodes 21d and 22b, for improving sensitivity thereof. The cantilevered detection electrodes 21d and 22b are apt to camber as the detection electrodes 21d and 22b become longer.

However, the camber of the detection electrodes 21d and 22b is reduced by removing the stress layer id facing the opening 2, so that the sensitivity of the angular velocity sensor can be improved.

(Third Embodiment)

Figure 4:
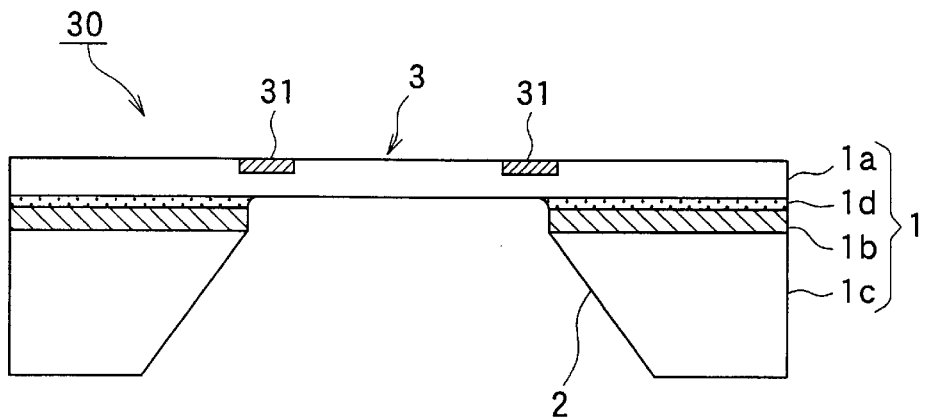
FIG. 4 is a schematic cross sectional view of a pressure sensor in the third embodiment of the present invention.
Figure 6:
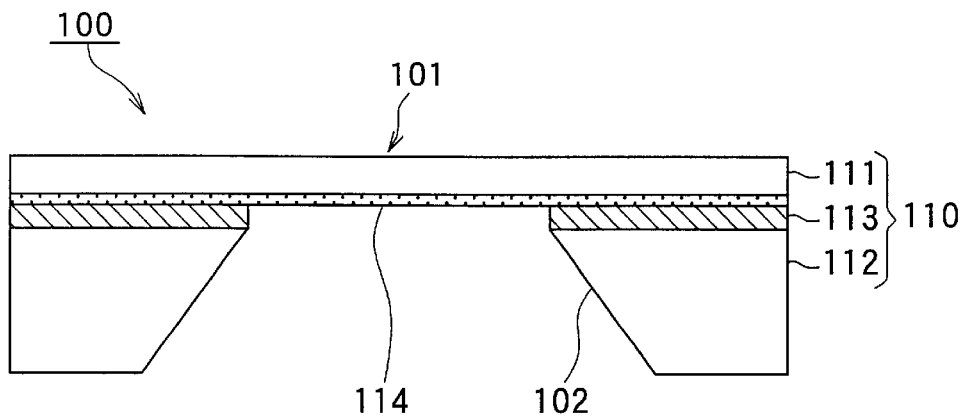
FIG. 6 is a schematic cross sectional view of a semiconductor dynamic quantity sensor in the prior art.
Figure 7:
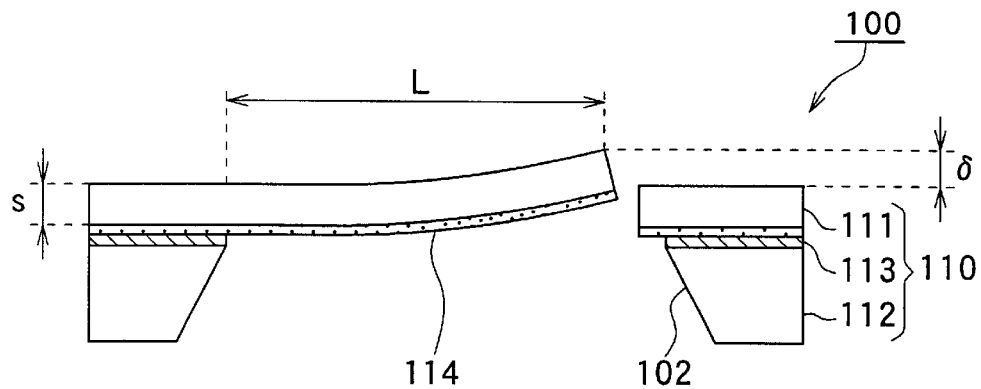
FIG. 7 is a schematic cross sectional view of a semiconductor dynamic quantity sensor showing deformation in the prior art.

In this embodiment, a pressure sensor is adopted as the semiconductor dynamic quantity sensor. Referring to FIG. 4, a SOI substrate 1 is employed to form a pressure sensor 30. A part of a supporting layer 1c, an oxide film 1b, and activation layer 1a (stress layer 1d) is removed so as to form an opening 2. A structure 3 is disposed on the opening 2.

The structure 3 is a diaphragm in this embodiment. Strain gauges 31 are formed on a surface of the activation layer 1a at a portion above an edge portion of the opening 2 as shown in FIG. 4. Similarly to the first and second embodiments, the stress layer 1d is removed at a back surface of the activation layer 1a, which faces the opening 2.

In such the pressure sensor 30, the strain gauges 31 and a circuit portion are formed on the surface of the activation layer 1a at first. Then, the same steps as shown in FIGS. 2C to 2H can be employed to complete the pressure sensor 30.

The pressure sensor 30 has the diaphragm that is supported by the activation layer at an entire periphery thereof.

Therefore, the diaphragm is not apt to camber in comparison with the detection electrodes in the acceleration sensor or the angular velocity sensor described above. However, size of the pressure sensor tends to be small so that slight deformation can be detected. Thus, the pressure sensor having small dimension may not detect pressure precisely because of balance in residual stress in the stress layer 1d, or sensitivity of the pressure sensor lowered by change of the residual stress in the stress layer 1d, which is caused by change of temperature around the sensor when the stress layer exists in the diaphragm.

Therefore, by employing the diaphragm in which the stress layer is removed, the sensitivity of the pressure sensor 30 is improved.

Incidentally, the stress layer is defined as a portion of the silicon substrate or material constituting a semiconductor substrate, which has high concentration of oxygen in comparison with the bulk of the silicon substrate or the material constituting the semiconductor substrate. In other words, as described above, the stress layer has the oxygen therein that is diffused from the oxide layer in the SOI substrate, for example.

While the present invention has been shown and described with reference to the foregoing preferred embodiment, it will be apparent to those skilled in the art that changes in form and detail may be therein without departing from the scope of the invention as defined in the appended claims.

What is claimed is:

1. A method for manufacturing a semiconductor dynamic quantity sensor, comprising steps of:
   providing a laminated semiconductor substrate in which a first semiconductor layer is laminated on a second semiconductor layer with an oxide film interposed therebetween, the first semiconductor layer being thinner than the second semiconductor layer;
   forming a movable structure in the first semiconductor layer, the movable structure having a back surface and being movable in accordance with a dynamic quantity applied thereto;
   forming an opening in the second substrate and the oxide film by removing a portion of the second semiconductor layer and the oxide film that is located under the movable structure; and
   removing a portion of the back surface of the movable structure formed in the first semiconductor layer, the portion facing the opening and including oxygen that causes stress to the movable structure.

2. A method according to claim 1, wherein the oxygen included in the portion of the first semiconductor layer causes camber of the movable structure.

3. A method according to claim 1, wherein the oxygen included in the portion of the first semiconductor layer is diffused from the oxide film when the semiconductor substrate is formed.

4. A method according to claim 1, wherein a removed thickness of the portion of the first semiconductor layer is 0.2 μm or more.

5. A method according to claim 1, wherein a removed thickness of the portion of the first semiconductor layer is 0.4 μm or more.

6. A method according to claim 1, wherein etching condition of the portion of the first semiconductor layer is different from that of the oxide film.

7. A method according to claim 1, wherein dry etching is performed to remove the portion of the first semiconductor layer.

8. A method according to claim 1, wherein the semiconductor dynamic quantity sensor is an angular velocity sensor.

9. A method for manufacturing a semiconductor dynamic quantity sensor, comprising steps of:
   providing a semiconductor substrate including a first semiconductor layer, a second semiconductor layer and an oxide film interposed between the first and second semiconductor layers, the first semiconductor layer being thinner than the second semiconductor layer;
   forming a movable structure in the first semiconductor layer, the movable structure having a back surface and being movable in accordance with a dynamic quantity applied thereto;
   forming an opening in the second substrate and the oxide film by removing a portion of the second semiconductor layer and the oxide film that is located under the movable structure; and
   removing a portion of the back surface of the movable structure formed in the first semiconductor layer, the portion facing the opening and including oxygen.

10. A semiconductor dynamic quantity sensor comprising:
    a semiconductor substrate having a first semiconductor layer, a second semiconductor layer, and an oxide film interposed between the first and second semiconductor layers, wherein the first semiconductor layer has a back surface close to the oxide film and has a thickness less than that of the second semiconductor layer;
    an oxygen including layer disposed between the oxide film and the first semiconductor layer; and
    a structure farmed in the first semiconductor layer above an opening which is formed in the second semiconductor layer, the structure detecting dynamic quantity that is applied thereto, wherein
      the oxygen including layer contacts the back surface of the first semiconductor layer while the oxygen including layer is removed at a region where the opening is located so that a portion of the back surface of the first semiconductor layer is exposed to the opening.

11. A semiconductor dynamic quantity sensor according to claim 10, wherein a removed thickness of the oxygen including layer is 0.2 μm or more.

12. A semiconductor dynamic quantity sensor according to claim 10, wherein a removed thickness of the oxygen including layer is 0.4 μm or more.

13. A semiconductor dynamic quantity sensor according to claim 10, the structure has a oscillator to detect angular velocity that is applied thereto.

* * * * *